United States Patent [19]
Derhacobian et al.

[11] Patent Number: 5,991,202
[45] Date of Patent: Nov. 23, 1999

[54] METHOD FOR REDUCING PROGRAM DISTURB DURING SELF-BOOSTING IN A NAND FLASH MEMORY

[75] Inventors: Narbeh Derhacobian, Belmont; Hao Fang, Cupertino, both of Calif.

[73] Assignee: Advanced Micro Devices, Inc., Sunnyvale, Calif.

[21] Appl. No.: 09/161,423

[22] Filed: Sep. 24, 1998

[51] Int. Cl.⁶ .................................................. G11C 11/34
[52] U.S. Cl. .................... 365/185.19; 365/185.17
[58] Field of Search ....................... 365/185.19, 185.17, 365/185.18, 185.23

[56] References Cited

U.S. PATENT DOCUMENTS 5,636,162  6/1997  Coffman .......................... 365/185.19
5,815,438  9/1998  Haddad .......................... 365/185.19

*Primary Examiner*—A. Zarabian

[57] ABSTRACT

A NAND flash memory system is programmed with minimal program disturb and pass disturb during self-boosting without resorting to impurity implantation for bit line isolation, to p-well biasing or to bit line biasing techniques. A program voltage is applied to a selected word line in the form of a plurality of short pulses while synchronously applying a pulsed pass voltage to the unselected word lines until the selected cell is programmed. The duration of the pulses and the time between pulses are chosen to minimize the program disturb of unselected cells, especially unselected cells on the selected word line, without causing pass disturb of any cell in the array.

20 Claims, 8 Drawing Sheets

METHOD FOR REDUCING PROGRAM DISTURB DURING SELF-BOOSTING IN A NAND FLASH MEMORY

FIELD OF THE INVENTION

The present invention relates to a method of programming a non-volatile semiconductor flash memory device. The invention has particular applicability in programming a flash memory having a NAND-type architecture which utilizes a self-boosting technique to aid programming.

BACKGROUND ART

Conventional flash memory systems, otherwise known as flash electrically erasable programmable read only memories (EEPROMs), typically comprise a two-dimensional array of floating gate memory transistors, or "cells", formed on a semiconductor substrate. It includes several strings, known as NAND strings, of floating gate memory transistors, each transistor coupled to the next transistor in the string by coupling the source of one device to the drain of the next device to form bit lines. A plurality of word lines, perpendicular to the NAND strings, each connect to the control gate of one memory cell of each NAND string.

Initially, the cells are erased so as to have a certain threshold voltage, such as −2 volts. To program a cell, the selected cell is charged to a higher threshold voltage by applying a high voltage for a predetermined period of time, such as about 18 volts for about 100 µs to about 250 µs, to the word line of the selected cell, while the threshold voltage of the remaining ("unselected") cells remains unchanged.

A problem arises when it is desired to program one selected cell on a word line without programming other cells on the same word line. When a voltage is applied to a word line, that voltage is applied not only to the selected cell but also to the cells along the same word line which are unselected for programming. An unselected cell on the word line, especially a cell adjacent to the selected cell, may become inadvertently programmed. The unintentional programming of an unselected cell in a selected word line is referred to as "program disturb".

Several techniques in combination are typically employed to prevent program disturb. In a method known as "self-boosting", the unselected bit lines are electrically isolated and a pass voltage, such as about 10 volts, is applied to the unselected word lines during programming. The unselected word lines capacitively couple to the unselected bit lines, causing a voltage, such as about 8 volts, to exist on the unselected bit lines, which tends to reduce program disturb. Disadvantageously, if the boosted voltage leaks from the unselected bit lines to the selected bit line (which has no voltage applied to it) during programming, disturb may occur in unselected cells on the selected bit line. This condition, which limits the amount of pass voltage which can be safely applied, hence limiting the effectiveness of the self-boosting technique, is referred to as pass disturb. The leakage path from the unselected bit lines to the selected bit line can be shut off if a negative bias is put on the substrate (also called the p-well). However, applying this charge to the p-well significantly lengthens the time required for programming, and requires additional circuitry and a corresponding increase in the size of the memory system.

Yet another conventional technique for reducing disturb is to isolate adjacent bit lines with a dopant such as boron. However, there is a limit to the amount of dopant which can be implanted into the substrate without causing undesirable electrical effects. Furthermore, this technique is problematic given the current demands for miniaturization and increased circuit density, which necessitate moving the bit lines closer together, leaving less room for such implantation.

Another method used to reduce program disturb is to place a positive bias on the selected bit line. However, this also lengthens the time required for programming, and necessitates an increase in the programming voltage to compensate for the positive bias.

There exists a need for a method of programming a NAND flash memory system with minimal program disturb which does not cause pass disturb or increase the size and complexity of the memory system.

SUMMARY OF THE INVENTION

An object of the present invention is a method of programming a NAND flash memory in a self-boosting mode that does not induce program disturb or pass disturb, and yet does not require the use of other manufacturing or programming techniques which are detrimental to the performance and/or increase the cost of the memory system.

According to the present invention, the foregoing and other objects are achieved in part by a method of programming a nonvolatile semiconductor memory having a plurality of strings of memory transistors, each string forming a bit line, arranged in parallel to form an array with a plurality of word lines, each word line coupled across the bit lines to one of the memory transistors in each of the bit lines in the array, the method comprising applying a program voltage as a plurality of pulses to a first word line coupled to a memory transistor that is to be programmed and synchronously applying a pass voltage as a plurality of pulses to word lines coupled to memory transistors that are not to be programmed, the plurality of pass voltage pulses and the plurality of program voltage pulses having the same duration and periodicity.

Another aspect of the present invention is a method of programming a nonvolatile semiconductor memory having first through nth NAND strings arranged in parallel, each NAND string having m memory transistors and first through mth word lines, each coupled to one memory transistor of each NAND string, with a selection transistor at an end of each NAND string in series with the memory transistors of their respective NAND string, which method comprises selecting a first memory transistor to be programmed, the first memory transistor being in the first NAND string; applying a supply voltage to a source/drain of the selection transistors associated with the second through nth NAND strings; applying the supply voltage to a gate of the selection transistors associated with the second through nth NAND strings to electrically isolate the channel regions of the memory transistors in the second through nth NAND strings; and applying a program voltage to the first word line as a series of pulses and simultaneously and synchronously applying a pass voltage as a series of pulses to the second through mth word lines to program the first memory transistor.

Additional objects and advantages of the present invention will become readily apparent to those skilled in this art from the following detailed description, wherein only the preferred embodiment of the invention is shown and described, simply by way of illustration of the best mode contemplated for carrying out the invention. As will be realized, the invention is capable of other and different embodiments, and its several details are capable of modifications in various obvious respects, all without departing from the invention. Accordingly, the drawings and description are to be regarded as illustrative in nature, and not as restrictive.

BRIEF DESCRIPTION OF THE DRAWINGS

Reference is made to the attached drawings, wherein elements having the same reference numeral designations represent like elements throughout, and wherein.

DESCRIPTION OF THE INVENTION

A key element in realizing a practical and functional flash memory system based on NAND architecture is to minimize program disturb; that is, unintentional programming of an unselected cell on a selected word line. Typical NAND flash memory programming techniques which use self-boosting to reduce program disturb introduce the problem of pass disturb (unintentional programming of unselected cells on the selected bit line), and conventional methods for avoiding pass disturb carry with them their own disadvantages. The present invention addresses and solves the problem of minimizing program disturb during self-boosting without relying on additional, disadvantageous methods such as bit line isolation, bit line bias or p-well bias.

According to the methodology of the present invention, a selected cell is programmed by first isolating the unselected bit lines, then applying a program voltage to the selected word line in the form of a plurality of short pulses while synchronously applying a pulsed pass voltage to the unselected word lines until the selected cell is programmed. The duration of the pulses and the time between pulses are chosen to minimize the program disturb of unselected cells on the selected word line without causing pass disturb of any cell in the array.

Figure 1:
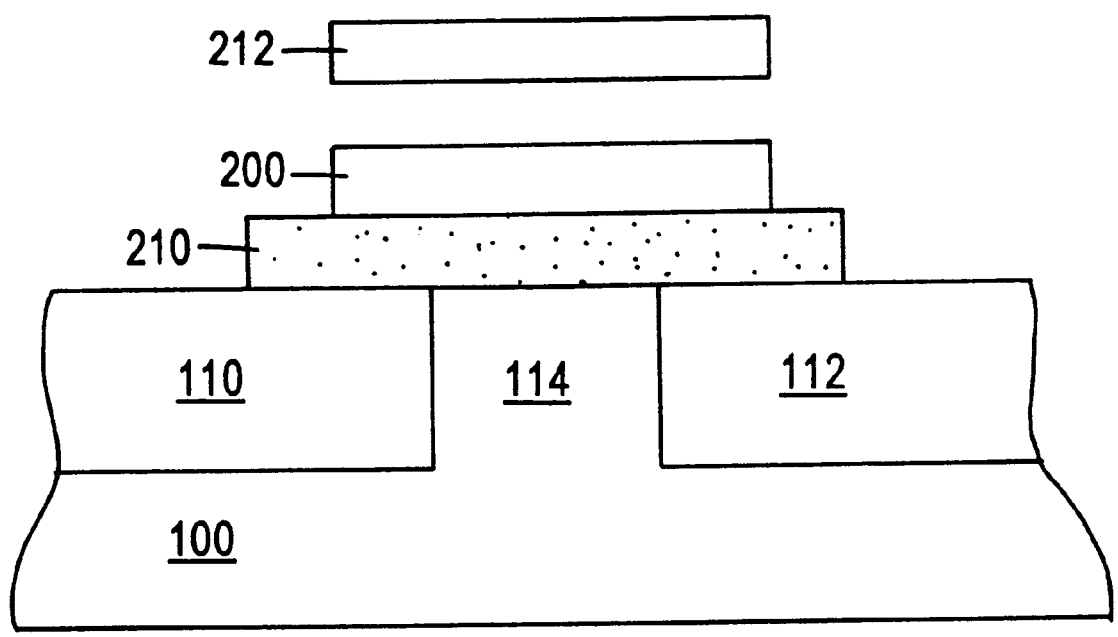
FIG. 1 is a cross-sectional view of a floating gate memory cell.

An embodiment of the present invention will be described with reference to FIGS. 1–3. FIG. 1 depicts a floating gate memory cell, which includes source region 110, drain region 112 and channel region 114 formed in substrate 100, and floating gate 200, gate oxide 210 and control gate 212 formed on the substrate 100. A voltage differential is created in the cell when there is a high voltage at the control gate 212 and a low voltage at the channel region 114. This voltage difference causes electrons to move from the channel region 114 to the floating gate 200 through a phenomenon known as tunneling, thus charging the floating gate 200. This movement of electrons is referred to as programming.

Figure 2:
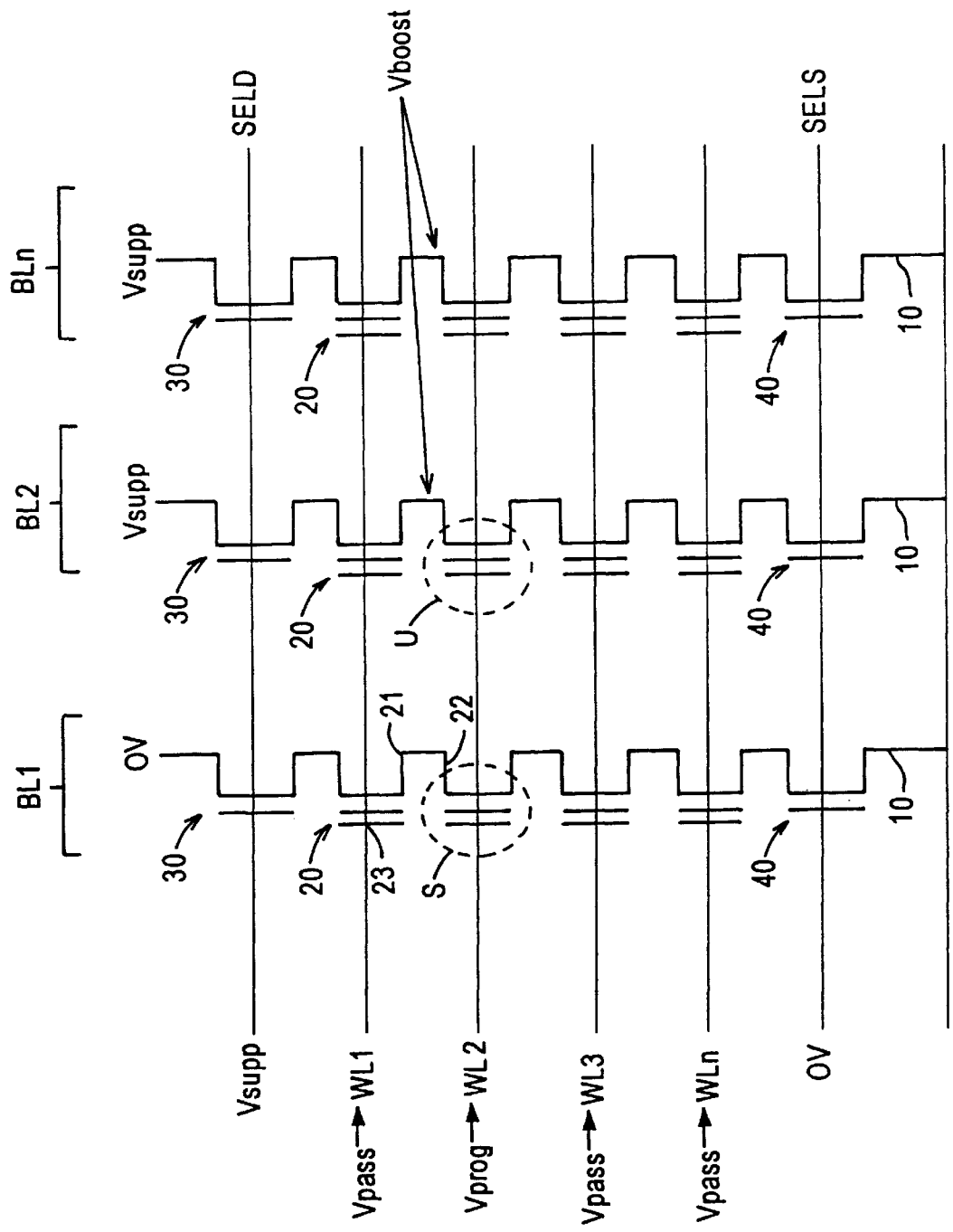
FIG. 2 is a schematic diagram of a NAND flash memory system.

A typical architecture for a flash memory system, referred to as a NAND architecture, is depicted in FIG. 2. It includes several strings 10, known as NAND strings, of floating gate memory transistors (or "memory cells") 20, each transistor 20 coupled to the next transistor 20 in the string 10 by coupling the source 21 of one transistor 20 to the drain 22 of the next transistor 20. At either end of each string 10 is a selection transistor, one of which is referred to as a select drain transistor 30, and the other of which is referred to as a select source transistor 40. Each NAND string 10 and its associated pair of transistors 30, 40 is known as a bit line BL1–BLn. A plurality of word lines WL1–WLm, perpendicular to the NAND strings 10, each connect to the control gate 23 of one memory cell 20 of each NAND string 10. A line SELS connects the gates of the select drain transistors 30, and a line SELS connects the gates of the select source transistors 40.

Figure 3A:
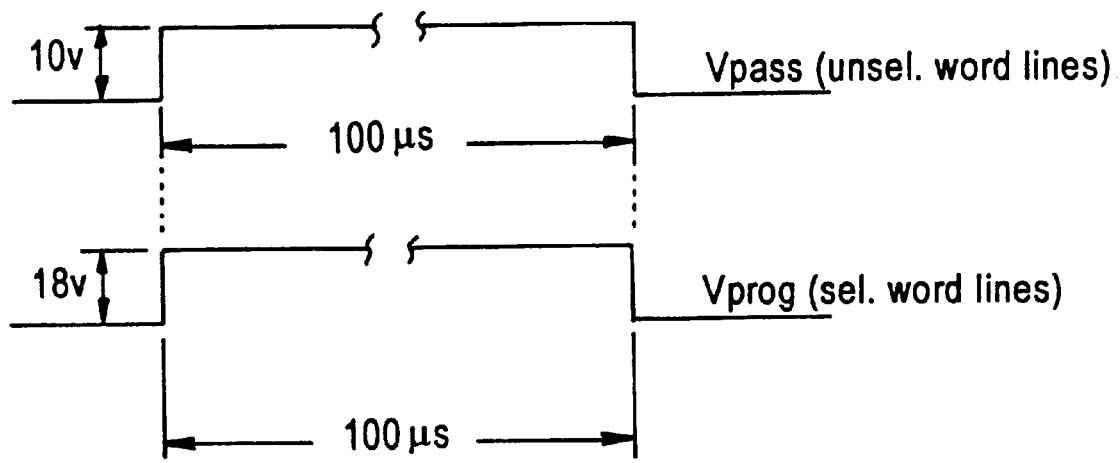
FIG. 3a is a graphical representation of a conventional NAND flash memory programming technique.
Figure 3B:
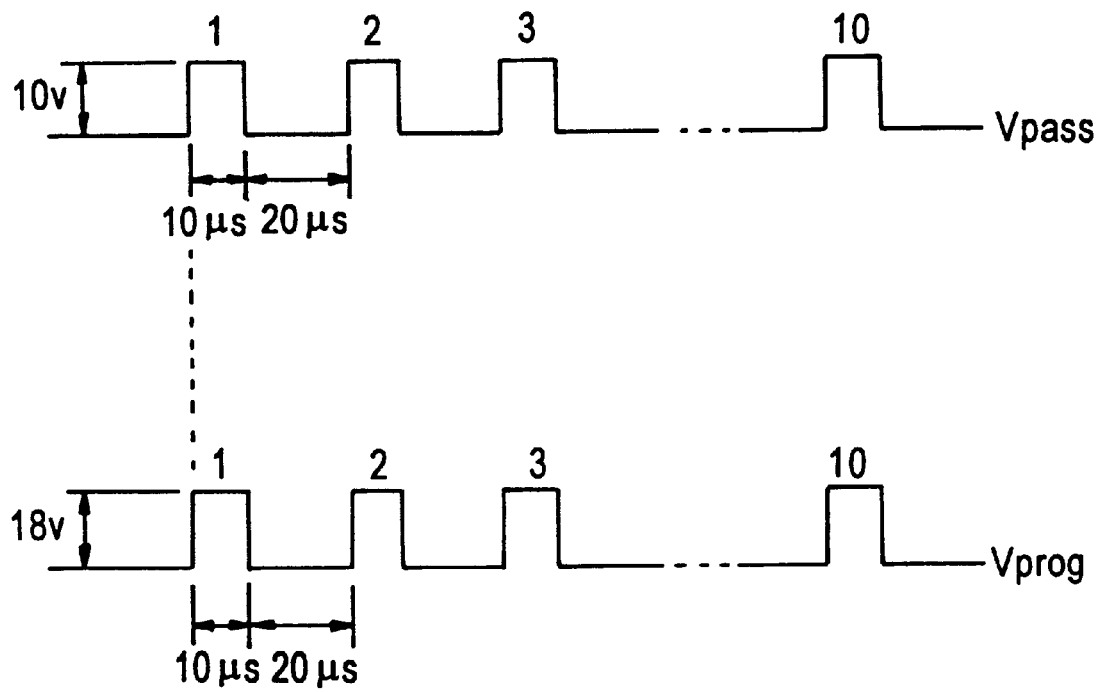
FIG. 3b is a graphical representation of a NAND flash memory programming technique according to the present invention.

To program a selected cell S at the intersection of a selected bit line BL1 and a selected word line WL2 according to the methodology of the present invention, the unselected bit lines BL2–BLn are first electrically isolated, as in conventional programming techniques, by applying a supply voltage Vsupp, such as about 3 volts, to both the drain and the gate of their select drain transistors 30 to turn the select drain transistors "off". Then, a program voltage Vprog, such as about 18 volts, is applied to the selected word line WL2 in the form of a plurality of pulses while a pass voltage Vpass, such as about 10 volts, is simultaneously and synchronously applied to the unselected word lines WL1 and WL3–WLm to produce a boost voltage Vboost, such as about 8 volts, on unselected bit lines BL2–BLn. The program voltage and pass voltage pulses are applied so that the accumulative length of the application of these voltages is sufficient to program selected cell S, such as about 100 μs to about 250 μs. A comparison of conventional voltage application and the voltage application of the inventive method is illustrated in FIGS. 3a and 3b. FIG. 3a shows the application of program voltage Vprog and pass voltage Vpass as a single pulse for 100 μs in conventional programming techniques, and FIG. 3b shows the application of the two voltages Vpass, Vprog as multiple pulses using the inventive method, in this example as ten pulses of 10 μs separated by 20 μs between pulses.

It is thought that disturb during self-boosting is due to a phenomenon referred to as "field threshold turn-on", wherein the selected bit line BL1 (which is at about 0 volts), an adjacent unselected bit line BL2 (which is at a boosted voltage Vboost of about 8 volts), and the selected word line WL2 (which is at the program voltage Vprog) form a parasitic transistor. The two bit lines BL1, BL2 act as source and drain and the selected word line WL2 acts as a gate to "turn on" the parasitic transistor during programming. When the parasitic transistor starts to leak, program disturb can occur. Alternately, any boosted unselected bit line can be thought of as a resistor-capacitor system. As the capacitor is charged, the resistor leaks its charge out to ground.

The length and number of the program and pass voltage pulses is chosen so that the above-described voltage leakage or discharge from the boosted bit lines does not have time to occur. The time between pulses is chosen to allow the pass voltage Vpass to reach zero before the next pulse begins. As the pulse period is reduced, the favorable effect on disturb lessens, since the pulse train begins to resemble the conventional single pulse voltage application. In certain embodiments of the invention, other factors such as program speed requirements and memory cell gate oxide thickness are also considered in choosing pulse parameters.

It was found that the inventive method is most effective if the program voltage and the pass voltage are applied in about 10 to about 25 pulses having a duration about 2 μs to about 10 μs, with about 2 μs to about 4 μs between pulses. In a preferred embodiment, about 20 pulses are applied having a duration of about 5 μs for a total voltage application time of about 100 μs, with about 2 μs to about 4 μs time in between pulses, to minimize programming time, program disturb and pass disturb. However, a reduction in total programming time is possible if the amplitude of the program voltage pulses is increased, providing some level of program disturb is tolerable.

Figure 4A:
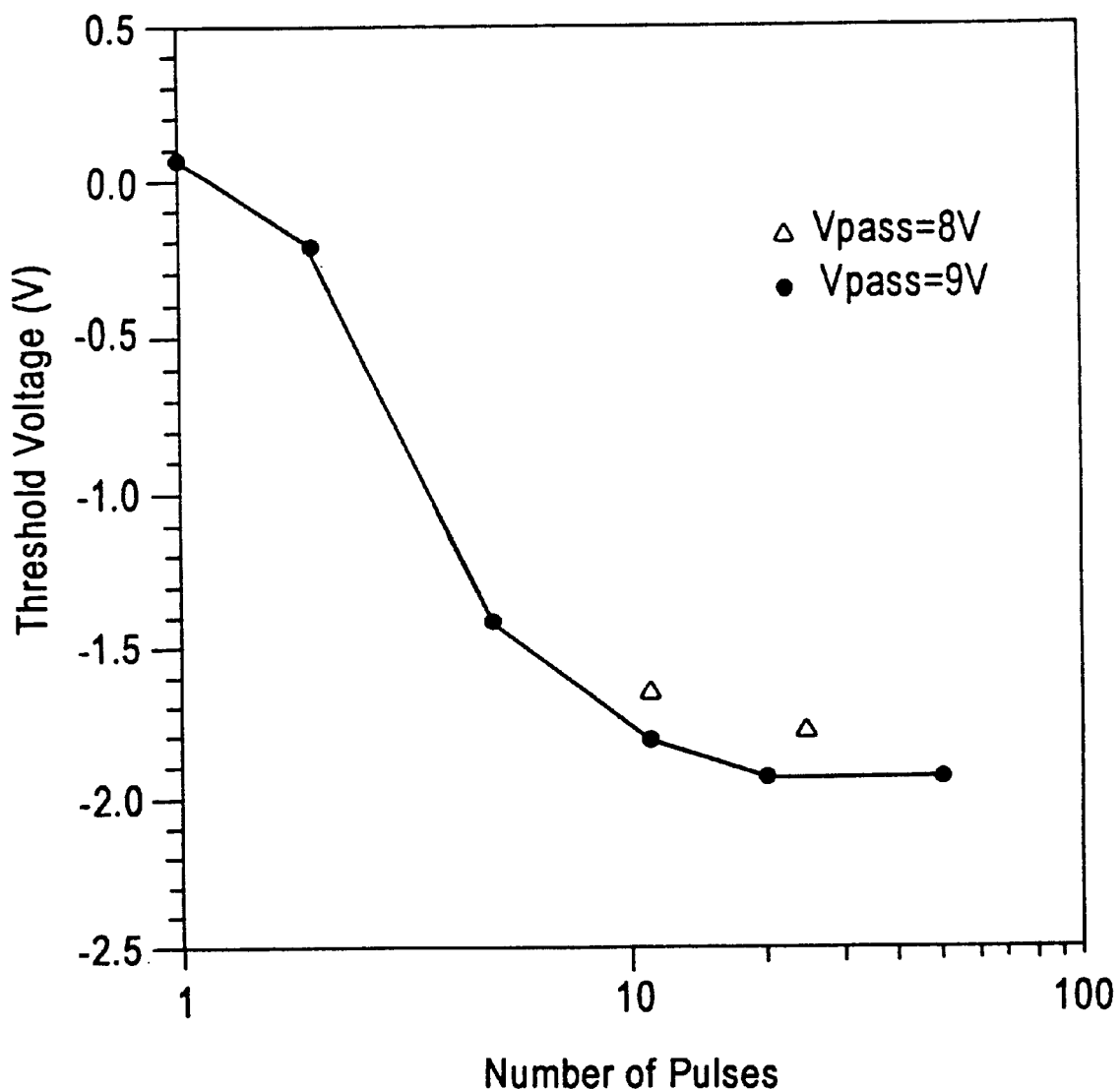
FIG. 4A is a graphical representation of the number of program and pass voltage pulses versus the threshold voltage of an unselected memory cell.

The effect of the number of pulses on program disturb is illustrated graphically in FIG. 4A, which plots the number of program and pass voltage pulses versus the threshold voltage of an unselected memory cell (e.g. cell U in FIG. 2) when the threshold voltage with no disturb is −2 volts and the accumulative pulse time is kept constant at, in this example, 100 µs. As the number of pulses is increased with a corresponding decrease in the width of the individual pulses, program disturb decreases dramatically, and is minimal at about 20–25 pulses.

Figure 4B:
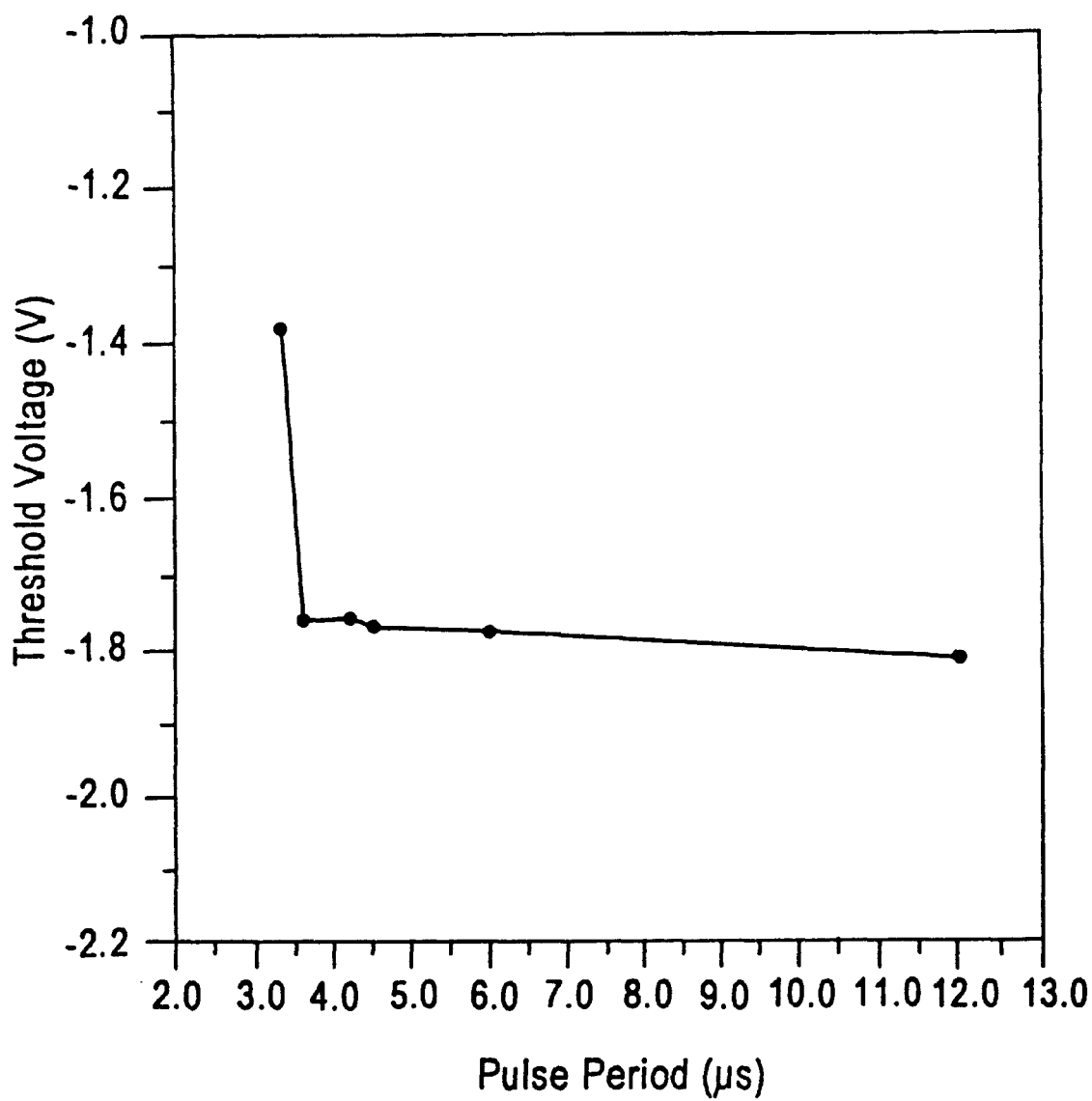
FIG. 4B is a graphical representation of pulse period versus program disturb.
Figure 5A:
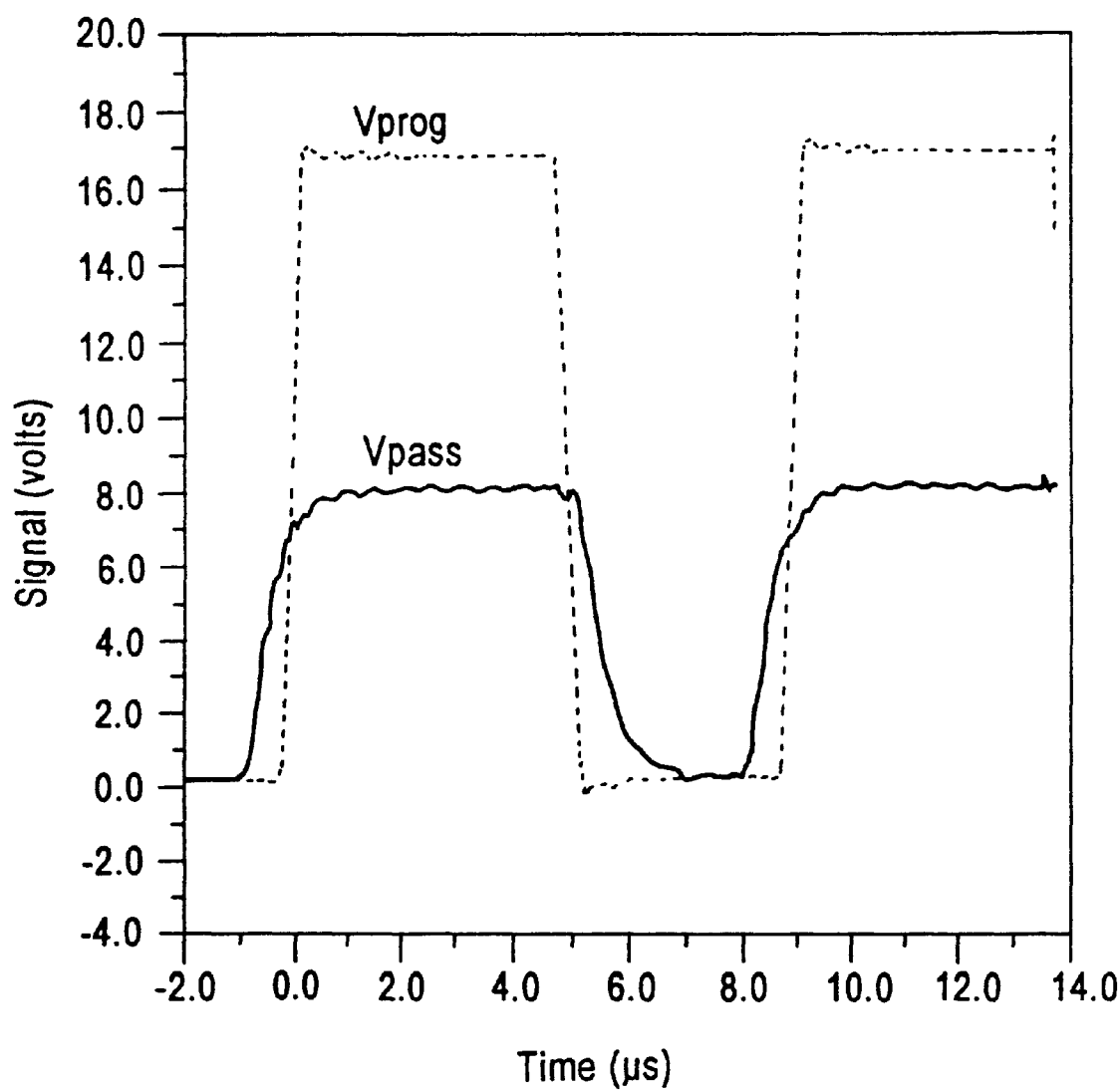
FIGS. 5A–5C are graphical representations of program voltage and pass voltage pulse cycles.
Figure 5B:
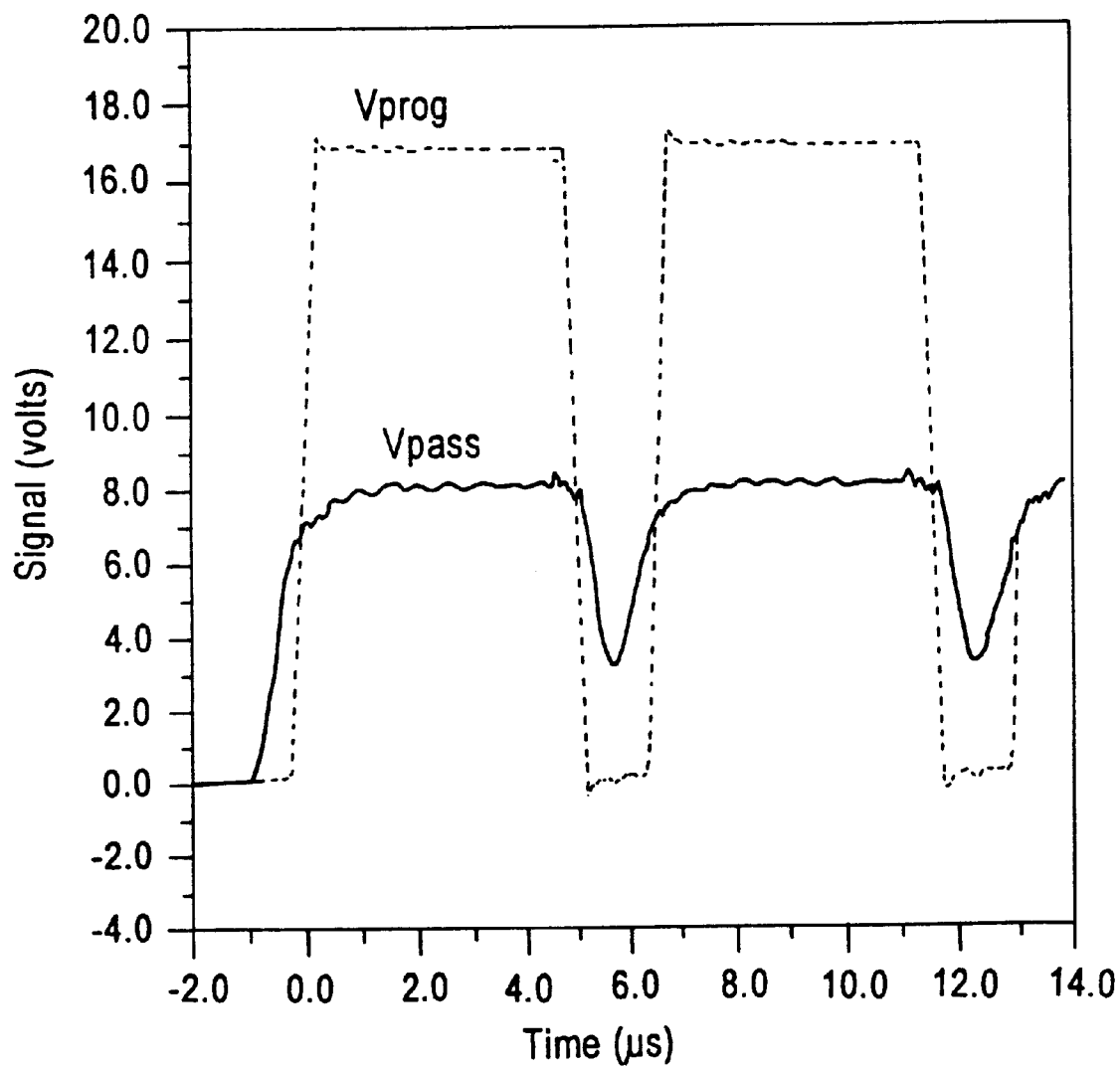
Figure 5C:
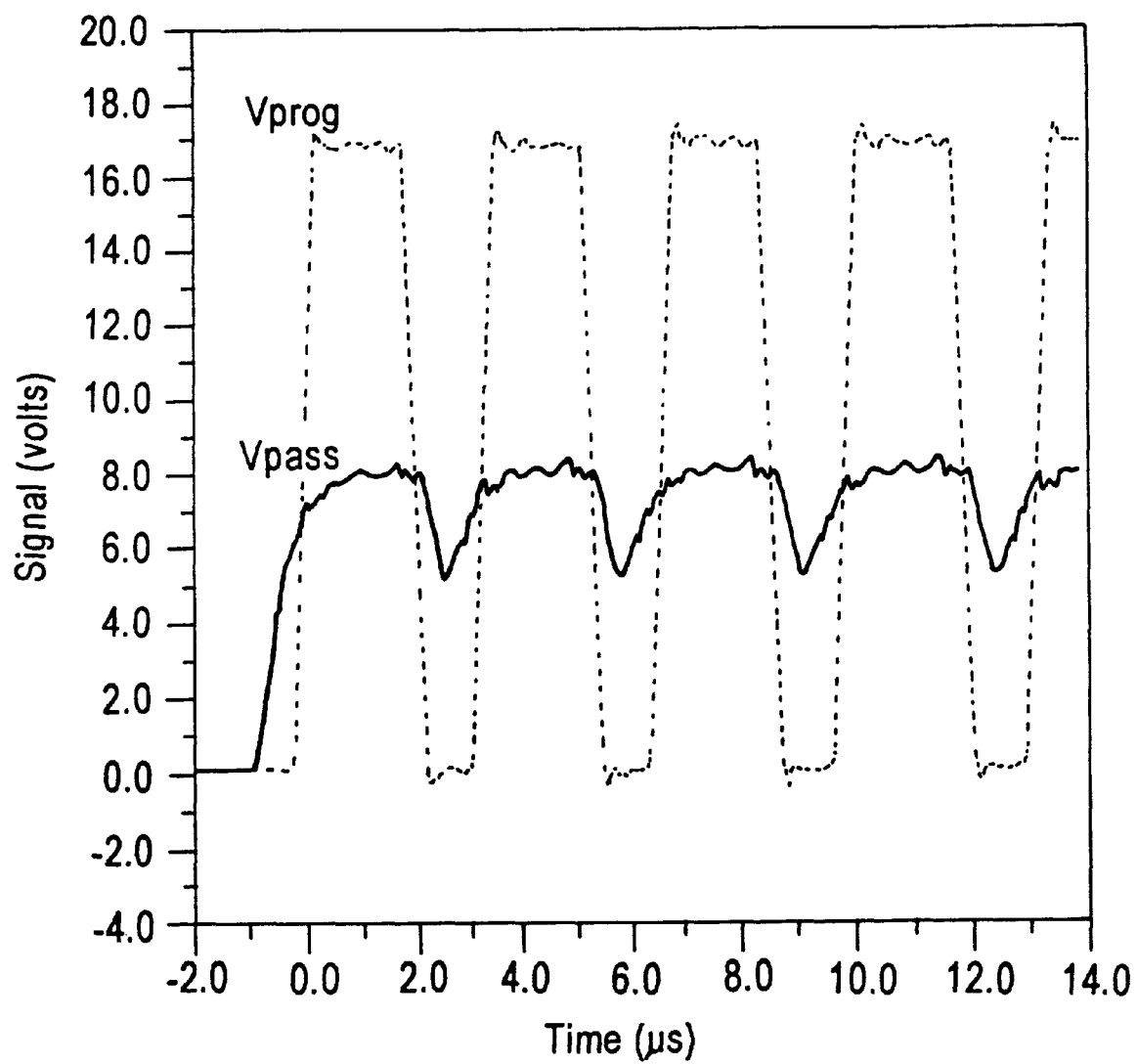

The invention's reduction of program disturb is dependent upon the duty cycle of the pulses; that is, upon the length of the individual pulses and the time between pulses. Generally, as the pulse period is reduced, the reduction in disturb lessens. For example, as shown in FIG. 4B, when the pulse period is less than about 3.0 µs, program disturb increases sharply. FIGS. 5A–5C, which are exemplary oscilloscope measurements of the Vprog and Vpass pulses, show that as the pulse period becomes equal to pulse width, the RC time constants create pulse shapes which resemble the prior art single pulse used for programming, thereby substantially obviating the advantages otherwise achieved by the invention, since Vpass is not permitted to return to zero between pulses. In FIG. 5A, the pulse width is 5 µs, the pulse period is about 9 µs, and the time between pulses is about 4 µs, thus allowing Vpass on the unselected word lines to return to zero between pulses. In FIG. 5B, the pulse width is still 5 µs, but the pulse period has been reduced to about 6.6 µs, the time between pulses now being about 1.6 µs. As a result, Vpass no longer drops to zero between pulses (Vpass drops to about 2 volts between pulses). In FIG. 5C, the pulse width has been reduced to 2 µs and the pulse period to about 3.3 µs, leaving about 1.3 µs between pulses. Vpass now drops only to 6 volts between pulses, and program disturb is not appreciably improved.

When the inventive methodology is utilized to program a NAND flash memory during self-boosting, program disturb and pass disturb are minimized without resorting to impurity implantation for bit line isolation, to p-well biasing or to bit line biasing techniques. Thus, performance of the flash memory system is dramatically improved without increasing the size or complexity of the system, and without introducing undesirable electrical characteristics.

The inventive method is applicable to current single-level NAND flash memory systems, which operate using two threshold voltage levels per cell (e.g., "high" +1 volt or "low" −2 volts) to store one bit of information per cell. Furthermore, it is especially useful for programming multilevel NAND flash memory systems currently being developed which use four threshold voltage levels per cell (e.g. −3 volts, −1 volt, 0 volts, and 1 volt) to store two bits of information per cell. Reducing disturb is critical in multilevel NAND flash memory applications, where the tolerance for disturb is smaller.

Only the preferred embodiment of the invention and but a few examples of its versatility are shown and described in the present disclosure. It is to be understood that the invention is capable of use in various other combinations and environments and is capable of changes or modifications within the scope of the inventive concept as expressed herein.

What is claimed is:

1. A method of programming a nonvolatile semiconductor memory having a plurality of strings of memory transistors, each string forming a bit line, arranged in parallel to form an array with a plurality of word lines, each word line coupled across the bit lines to one of the memory transistors in each of the bit lines in the array, the method comprising:

applying a program voltage as a plurality of pulses to a first word line coupled to a memory transistor that is to be programmed; and synchronously applying a pass voltage as a plurality of pulses to word lines coupled to memory transistors that are not to be programmed, the plurality of pass voltage pulses and the plurality of program voltage pulses having the same duration and periodicity.

2. The method according to claim 1, further comprising applying voltages to the bit lines to select which transistor coupled to the first word line is programmed when the program voltage pulses are applied to the first word line.

3. The method according to claim 1, wherein the program voltage is between about 14 and 22 volts and the pass voltage is between about 7 and 13 volts.

4. The method according to claim 3, wherein the program voltage is about 18 volts and the pass voltage is about 10 volts.

5. The method according to claim 3, comprising applying the program and pass voltage pulses for an accumulative pulse time of about 100 µs to about 250 µs.

6. The method according to claim 5, wherein the number of program voltage pulses and the number of pass voltage pulses are between about 10 pulses to about 25 pulses.

7. The method according to claim 6, wherein each pulse has a duration of between about 2 µs to about 10 µs.

8. The method according to claim 7, comprising applying the program and the pass voltages with about 2 µs to about 4 µs between pulses.

9. The method according to claim 4, comprising applying the program and the pass voltages in the form of about 20 pulses, each pulse having a duration of about 5 µs, with about 2 µs to about 3 µs between pulses.

10. The method according to claim 1, further comprising electrically isolating memory transistors that are not to be programmed prior to applying the program voltage pulses and the pass voltage pulses.

11. The method according to claim 10, wherein the step of isolating includes applying a supply voltage to bit lines that contain no memory transistor to be programmed.

12. The method according to claim 11, wherein each bit line has a selection transistor at one end in series with the memory transistors of the bit line, the method further comprising:

applying the supply voltage to a source/drain of the selection transistor of bit lines that contain no memory transistor to be programmed; and applying the supply voltage to a gate of the selection transistor of bit lines that contain no memory transistor to be programmed.

13. The method according to claim 12, wherein the supply voltage is about 3 volts.

14. A method of programming a nonvolatile semiconductor memory having first through nth NAND strings arranged in parallel, each NAND string having m memory transistors and first through mth word lines, each coupled to one memory transistor of each NAND string, with a selection transistor at an end of each NAND string in series with the memory transistors of their respective NAND string, which method comprises:

selecting a first memory transistor to be programmed, the first memory transistor being in the first NAND string;

applying a supply voltage to a source/drain of the selection transistors associated with the second through nth NAND strings;

applying the supply voltage to a gate of the selection transistors associated with the second through nth NAND strings to electrically isolate the channel regions of the memory transistors in the second through nth NAND strings; and applying a program voltage to the first word line as a series of pulses and simultaneously and synchronously applying a pass voltage as a series of pulses to the second through mth word lines to program the first memory transistor.

15. The method according to claim 14, wherein the supply voltage is about 3 volts.

16. The method according to claim 14, wherein the program voltage is about 18 volts.

17. The method according to claim 16, wherein the pass voltage is about 10 volts.

18. The method according to claim 17, wherein the number of program voltage pulses and number of pass voltage pulses are about 20 pulses.

19. The method according to claim 18, wherein each pulse has a duration of about 5 $\mu$s.

20. The method according to claim 19, comprising applying the program and the pass voltages with about 2 $\mu$s to about 4 $\mu$s between pulses.

* * * * *